United States Patent
Katz et al.

(10) Patent No.: US 10,158,075 B2
(45) Date of Patent: *Dec. 18, 2018

(54) PATTERNING DEVICES USING FLUORINATED COMPOUNDS

(71) Applicant: The Johns Hopkins University, Baltimore, MD (US)

(72) Inventors: Howard E. Katz, Owings Mill, MD (US); Bal Mukund Dhar, Baltimore, MD (US)

(73) Assignee: The Johns Hopkins University, Baltimore, MD (US)

(*) Notice: Subject to any disclaimer, the term of this patent is extended or adjusted under 35 U.S.C. 154(b) by 0 days.

This patent is subject to a terminal disclaimer.

(21) Appl. No.: 15/722,856

(22) Filed: Oct. 2, 2017

(65) Prior Publication Data

US 2018/0090684 A1    Mar. 29, 2018

Related U.S. Application Data

(60) Continuation of application No. 15/226,411, filed on Aug. 2, 2016, now Pat. No. 9,806,259, which is a
(Continued)

(51) Int. Cl.
*H01L 51/00* (2006.01)
*G03F 7/00* (2006.01)
(Continued)

(52) U.S. Cl.
CPC ........ *H01L 51/0018* (2013.01); *G03F 7/0035* (2013.01); *G03F 7/70058* (2013.01);
(Continued)

(58) Field of Classification Search
CPC . H01L 51/0032; H01L 51/05; H01L 51/0545; H01L 51/0043; H01L 51/0039;
(Continued)

(56) References Cited

U.S. PATENT DOCUMENTS

| 4,780,790 A | 10/1988 | Takimoto et al. |
| 7,173,310 B2 | 2/2007 | Voldman et al. |

(Continued)

FOREIGN PATENT DOCUMENTS

KR    102008001292    2/2008

OTHER PUBLICATIONS

DeFranco et al, Photolithographic Patterning of Organic Electronic Materials, Organic Electronics 7 (2006) pp. 22-28.
(Continued)

*Primary Examiner* — Thanh T Nguyen
(74) *Attorney, Agent, or Firm* — Venable LLP; Henry J. Daley

(57) ABSTRACT

A method for producing a spatially patterned structure includes forming a layer of a material on at least a portion of a substructure of the spatially patterned structure, forming a barrier layer of a flourinated material on the layer of material to provide an intermediate structure, and exposing the intermediate structure to at least one of a second material or radiation to cause at least one of a chemical change or a structural change to at least a portion of the intermediate structure. The barrier layer substantially protects the layer of the material from chemical and structural changes during the exposing. Substructures are produced according to this method.

7 Claims, 13 Drawing Sheets

Related U.S. Application Data continuation of application No. 14/742,894, filed on Jun. 18, 2015, now abandoned, which is a division of application No. 12/864,407, filed as application No. PCT/US2009/040255 on Apr. 10, 2009, now Pat. No. 9,091,913.

(60) Provisional application No. 61/123,678, filed on Apr. 10, 2008.

(51) Int. Cl.
*H01L 51/52* (2006.01)
*G03F 7/20* (2006.01)
*H01L 51/05* (2006.01)
*H01L 51/10* (2006.01)

(52) U.S. Cl.
CPC ...... *H01L 51/0014* (2013.01); *H01L 51/0023* (2013.01); *H01L 51/0097* (2013.01); *H01L 51/0541* (2013.01); *H01L 51/52* (2013.01); *H01L 51/0545* (2013.01); *H01L 51/102* (2013.01); *Y10T 428/24479* (2015.01)

(58) Field of Classification Search
CPC ............. H01L 51/0035; H01L 51/0508; H01L 51/5296; H01L 27/1214; H01L 27/1285; H01L 27/3244; H01L 27/3272; H01L 27/3274; H01L 29/41733; H01L 2924/12044; H01L 21/04; H01L 51/0014; H01L 51/0018; H01L 51/0023; H01L 51/0097; H01L 51/0541; H01L 51/52; H01L 51/102; H01L 428/24479; H01L 51/42; H01L 51/50; H01L 29/04; B32B 3/10; G03F 7/20; G03F 7/0035; G03F 7/70058; Y10T 428/24479
See application file for complete search history.

(56) References Cited

U.S. PATENT DOCUMENTS

| | | | |
|---|---|---|---|
| 9,091,913 B2 * | 7/2015 | Katz | ............... G03F 7/0035 |
| 9,806,259 B2 * | 10/2017 | Katz | ............... H01L 51/0018 |
| 2002/0126244 A1 | 9/2002 | Kim et al. | |
| 2003/0194709 A1 * | 10/2003 | Yang | ............... B01J 19/0046 |
| | | | 506/43 |
| 2006/0049413 A1 | 3/2006 | Byun et al. | |
| 2006/0162828 A1 | 7/2006 | Koch | |
| 2006/0183394 A1 | 8/2006 | Kim et al. | |
| 2006/0216872 A1 | 9/2006 | Arai et al. | |
| 2007/0040169 A1 | 2/2007 | Kim et al. | |
| 2007/0108899 A1 | 5/2007 | Jung et al. | |
| 2007/0222922 A1 | 9/2007 | Jin et al. | |
| 2008/0038881 A1 | 2/2008 | Shin et al. | |
| 2008/0143251 A1 | 6/2008 | Mathea et al. | |
| 2008/0261276 A1 | 10/2008 | Ponjee et al. | |
| 2010/0028356 A1 | 2/2010 | Schofield et al. | |
| 2010/0301310 A1 | 12/2010 | Noguchi et al. | |

OTHER PUBLICATIONS

Gelinck et al., "Flexible active-matrix displays and shift registers based on solution-processed organic transistors," Nature Materials, vol. 3, pp. 106-110 (2004).

International Search Report for PCT/US2009/040255 dated Dec. 1, 2009.

Kymissis et al, Patterning Pentacene Organic Thin Film Transistors, J. Vac. Sci. Technol. B 20.3., (2002), pp. 956-969.

Zihihong Nie and Eugenia Kumacheva, Patterning Surfaces with Functional Polymers, Nature materials, vol. 7, (Apr. 2008) pp. 277-290.

\* cited by examiner

PATTERNING DEVICES USING FLUORINATED COMPOUNDS

CROSS-REFERENCE OF RELATED APPLICATION

This application is a continuation application of U.S. application Ser. No. 15/226,411, filed Aug. 2, 2016, which is a continuation application of U.S. application Ser. No. 14/742,894, filed Jun. 18, 2015, which is a divisional application of U.S. application Ser. No. 12/864,407, filed Jul. 23, 2010 (now U.S. Pat. No. 9,091,913, issued Jul. 28, 2015), which is a national stage application under 35 U.S.C. § 371 of International Application No. PCT/US2009/040255, filed Apr. 10, 2009, which claims the benefit of U.S. Provisional Application No. 61/123,678 filed Apr. 10, 2008, the entire contents of which are hereby incorporated by reference in their entirety.

This invention was made with government support under Grant No. FA9550-06-1-0076 awarded by USAF AFOSR and Grant No. DE-FG02-07ER46465 awarded DOE. The government has certain rights in the invention.

BACKGROUND

1. Field of Invention

The current invention relates to methods of producing spatially patterned structures, and more particularly to methods of producing spatially patterned structures using fluorinated compounds. The current invention also relates to structures produced according to the methods. The current invention also relates to thin-film, lateral, organic heterojunction diodes.

2. Discussion of Related Art

Traditional photolithographic patterning has not proven useful to pattern organic semiconductors, and organic materials in general, because of damage by the photoresist, developer and acetone during the processing (Patterning Surfaces with Functional Polymers, Zhihong Nie and Eugenia Kumacheva, Nature materials, vol. 7, (April 2008)). Several approaches have been used to pattern organic semiconductors ranging from (a) use of parylene as a protective layer (Patterning Pentacene Organic Thin Film Transistors, Kymissis et al, J. Vac. Sci. Technol. B 20.3., (2002)), (b) use of parylene as mechanical resist (Photolithographic Patterning of Organic Electronic Materials, DeFranco et al, Organic Electronics 7 (2006) 22-28) and (c) use of UV curable precursors to pentacene (Flexible active-matrix displays and shift registers based on solution-processed organic transistors, Gelinck et al, Nature Materials, Vol 3, (2004)). The approach (a) can only be used to make bottom contact circuits and devices which have an order of magnitude lower performance. The approach (b), in addition to having the problems of approach (a), also has a problem of damage to the underlying parylene layer during mechanical peel off of parylene. The approach (c) is limited to only pentacene and has problems of lower mobility.

In addition, organic heterojunctions have been an extensive area of research for more than two decades and have found successful applications in Organic Light Emitting Diodes (OLEDs), and organic photovoltaics. While OLEDs are already on the market in display applications and are poised to enter the solid state lighting market in the near future, solar cells based on organic heterojunctions still need to achieve higher efficiencies to be commercially viable. With the advent of solar cells and OLED devices with increasingly complex device configurations and morphologies, it has become difficult to isolate and understand the various physical processes occurring at different interfaces and in the bulk at applied bias and in the presence of light. While devices based on organic heterojunctions have achieved significant technological milestones, the science behind them is still not completely understood and new techniques are needed to study the physics of such diodes Because of the "buried" nature of interfaces in vertical or bulk heterojunctions, there has been little attempt to study properties, such as conductivity, dielectric constant, and morphology, on both sides of such interfaces in one device.

Therefore, there remains a need for improved methods of producing spatially patterned structures and structures produced according to the improved methods.

SUMMARY

A method for producing a spatially patterned structure according to an embodiment of the current invention includes forming a layer of a material on at least a portion of a substructure of the spatially patterned structure, forming a barrier layer of a fluorinated material on the layer of material to provide an intermediate structure, and exposing the intermediate structure to at least one of a second material or radiation to cause at least one of a chemical change or a structural change to at least a portion of the intermediate structure. The barrier layer substantially protects the layer of the material from chemical and structural changes during the exposing.

A method for producing a spatially patterned structure according to an embodiment of the current invention includes providing a substructure of the spatially patterned structure, forming a barrier layer of a fluorinated material on the substructure to provide an intermediate structure, and removing the barrier layer of fluorinated material from the intermediate structure. The barrier layer substantially protects at least a portion of the substructure from chemical and structural changes during the producing the spatially patterned structure. Substructures according to some embodiments of the current invention are produced according to methods according to some embodiments of the current invention.

A diode according to an embodiment of the current invention has a substructure, a thin film of an n-channel organic semiconductor formed on the substructure, a thin film of a p-channel organic semiconductor formed on the substructure in a position laterally displaced from the thin film of the n-type organic semiconductor so as to form a p-n heterojunction in a lateral arrangement on the substructure.

BRIEF DESCRIPTION OF THE DRAWINGS

Further objectives and advantages will become apparent from a consideration of the description, drawings, and examples.

FIG. 7 also provides a schematic illustration of a thin-film, lateral heterojunction, organic diode according to an embodiment of the current invention and which can be made by the illustrated method.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited herein are incorporated by reference as if each had been individually incorporated.

While none of the conventional methods mentioned above are general in nature, we describe here a method of patterning materials which can be ubiquitously applied to pattern, in principle, any material and corresponding device, including devices that have spatially patterned organic semiconductor materials. However, the general concepts of the current invention are not limited to only organic semiconductor devices. Other embodiments of the current invention include inorganic semiconductor devices and devices that include biological materials such as bio-sensors, for example. Biological materials can include, but are not limited to, films of proteins, lipids, DNA or other biological macromolecules or other soft matter.

Figure 1:
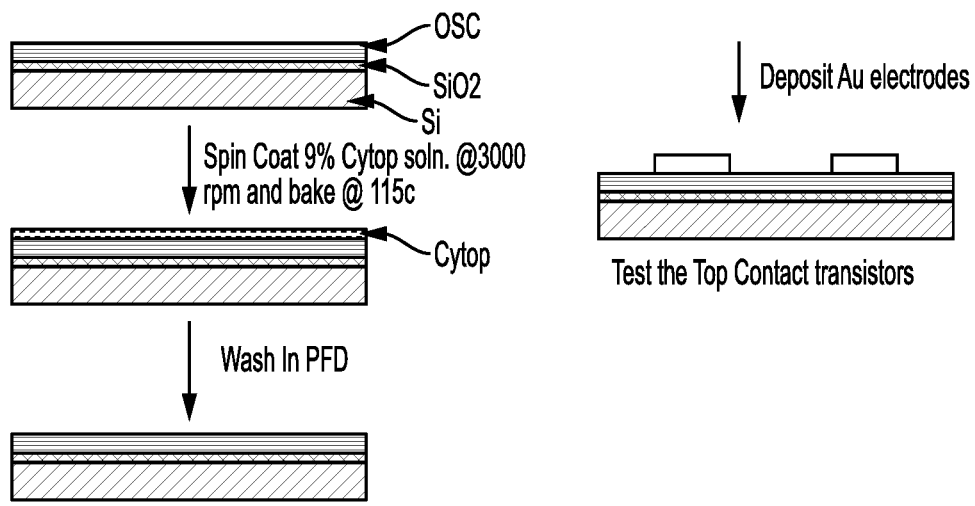
FIG. 1 is a schematic illustration to demonstrate non-damaging properties of processing methods using CYTOP and perfluorodecalin (PFD) according to some embodiments of the current invention.

FIG. 1 is a schematic illustration that helps describe some concepts of some embodiments of the current invention. A method for producing a spatially patterned structure 100 according to an embodiment of the current invention includes forming a layer of a material 102 on at least a portion of a substructure 104 of the spatially patterned structure 100. In this embodiment, the substructure 104 includes a substrate 106 with a dielectric layer 108 on the substrate 106. The invention is not limited to only this example of a substructure 104. The substructure 104 can be a less or more complex substructure than the example illustrated. In this example, the layer of material 102 is an organic semiconductor (OSC), the substrate 106 is a silicon substrate, and the dielectric layer 108 is a silicon dioxide layer. The general concepts of the current invention are not limited to only these examples. The method according to this embodiment of the current invention further includes forming a barrier layer of a fluorinated material 110 on the layer of material 102 to provide an intermediate structure 112. In this example the fluorinated material is the commercially available fluorinated polymer caned CYTOP. Although not shown in FIG. 1, additional processing steps can include adding additional layers of material and further chemical, photolithographic and/or additional processing. The specific example of FIG. 1 is provided to demonstrate that including the CYTOP layer and then removing it does not cause undesirable effects on the resulting spatially patterned structure 100. A fluorinated solvent is used to remove the layer of fluorinated material 110. For example, perfluorodecalin (PFD) can be used as the fluorinated solvent in some embodiments of the current invention. Embodiments of the current invention can also include exposing the intermediate structure 112 to at least one of a material or radiation to cause at least one of a chemical or structural change to a portion of the intermediate structure 112. The barrier layer 110 substantially protects the layer of the material 102 from chemical and structural changes during the exposing.

Figure 1A:
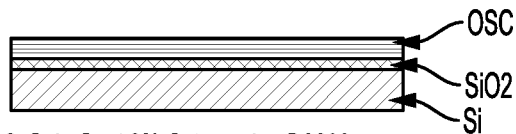
FIG. 1A is schematic illustration of a method of producing a spatially patterned structure according to an embodiment of the current invention
Figure 1A:
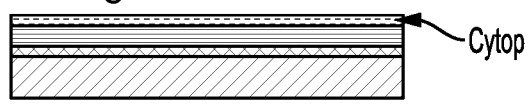
Figure 1A:
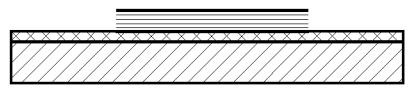
Figure 1A:
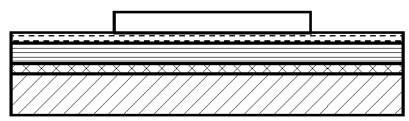
Figure 1A:
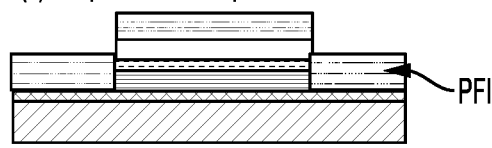
Figure 1A:
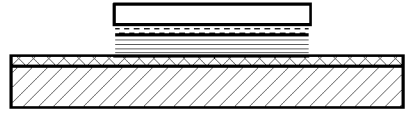
Figure 1A:
Figure 2A:
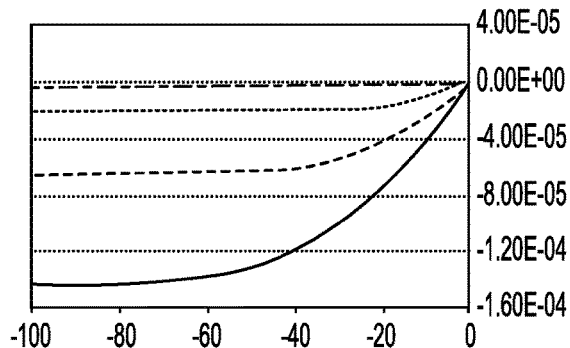
FIGS. 2A and 2B show output curves for pentacene OFETs (organic field effect transistors) (FIG. 2A) control samples and (FIG. 2B) after CYTOP and PFD treatment, as illustrated in FIG. 1.
Figure 2B:
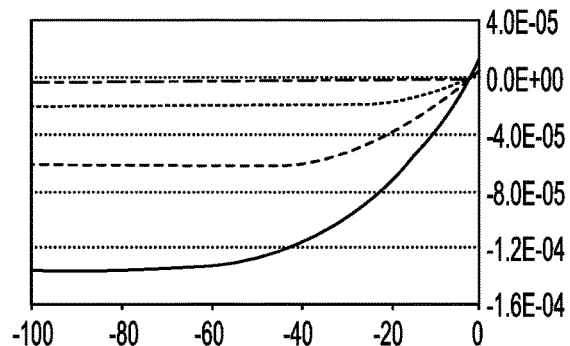

In FIG. 1, a conductive silicon wafer 106 on which silicon dioxide 108 and an organic semiconductor film (pentacene) 102 were deposited was further supplied with a spincoated CYTOP film 110. The CYTOP film 110 was then removed by immersion in perfluorodecalin. Gold electrodes 144, 116 were vacuum evaporated onto the organic semiconductor film 102 through a shadow mask to complete the formation of a transistor. FIG. 1A illustrates another example of a method of producing a spatially patterned structure according to an embodiment of the current invention. This example includes photolithographic steps and subsequent processing that can be used in some embodiments of the current invention. FIGS. 2A and 2B show output curves for pentacene OFETs (FIG. 2A) control samples and (FIG. 2B) after CYTOP and PFD treatment described above in reference to FIG. 1. The curves are essentially identical, showing the lack of damaging effects of the CYTOP and perfluorodecalin.

The broad concepts of the current invention are not limited to only the particular fluorinated materials mentioned above. For example, molecular solids such as perfluoroeicosane can also be used instead of or in addition to CYTOP in some embodiments of the current invention. The main attributes according to some embodiments of the current invention are that the material be soluble or subject to liftoff in a fluorinated solvent, insoluble in any other solvent, have a very low surface energy in order to repel overlying solutions, and be volatile so that it can be sublimed. A melting point above 100° C. can be desirable in some embodiments in order to ensure thermal stability of the barrier layer as long as it is needed.

Other examples of fluorinated materials according to some embodiments of the current invention include, but are not limited to, any one or combination of the following:

Perfluoropentadecane ($C_{15}F_{32}$) which has a melting point of 110-113° C. and is commercially available.

Perfluoroeicosane ($C_{20}F_{42}$) which has a melting point of 164-166° C. and is commercially available.

Perfluorotetracosane ($C_{24}F_{50}$) which has a melting point of 188-190° C. and is commercially available.

At some size point, the molecule might become such a stable solid that it would not dissolve in the fluorinated solvent, though it might still lift off. In that case, it could also become more difficult to sublime.

There is no requirement that the barrier molecules be linear, or have the exact $C_nF_{(2n+2)}$ formula, though these seem to be more available and are more likely to be solids. Also, while they should be predominantly composed of $CF_2$ units, incorporation of up to 20% of some other chemical functionality can be allowable in some embodiments if the solubility property is not unduly influenced by the other functionality. For example, a compound comprising 4 $CH_2$ groups and 16 $CF_2$ groups should work, but adding a COOH group would greatly alter the solubility property and therefore COOH compounds (carboxylic acids) may not be suitable according to some embodiments of this invention. If a lower melting point can be tolerated, then perfluorododecane (mp 75-77° C.) and perfluorocyclohexane (mp 51° C.) are commercially available, but would be more difficult to handle in an evaporation/sublimation system because of their higher vapor pressures.

Fluorinated polymers can also be used as fluorinated materials for barrier layers according to some embodiments of the current invention. As we described above, commercially available CYTOP can be used. Also, TEFLON-AF, commercially available from DuPont, can be used in some embodiments of the current invention. More generally, there are classes of polymers such as poly(siloxanes), poly(methacrylates), poly(acrylates), and polystyrenes that do not ordinarily have the correct solubility and surface properties, but could be adapted to if they were substituted with large enough fluorinated side groups so that these groups dominated the solubility and surface energy properties. At least eight or so fully fluorinated and saturated carbons would be required on each monomer unit for the solubility and surface properties to be adequate according to some embodiments of the current invention. More than eight fully fluorinated and saturated carbons on each monomer unit can be provided according to some embodiments of the current invention. Monomers to make such polymers are commercially available, or can be made using methods known in the art. The utility of any one of these polymers would depend on specific physical attributes, such as whether it had a high enough Tg to form a solid film, formed a useful spincoatable solution, etc. Any combinations of the above fluorinated materials that are suitable for the particular applications can also be used according to other embodiments of the current invention.

Fluorinated solvents according to some embodiments of the current invention are not limited to only PFD as described above in regard to one particular example. There are many choices of commercially available fluorinated solvents for performing the liftoff/barrier removal procedures. These include, but are not limited to, perfluorodecalin, perfluoro(1,2- or 1,3-dimethylcyclohexane), perfluorokerosene, perfluoro(methyldecalin), and perfluoroheptane mixed isomers, and combinations thereof. Even a low-melting, volatile fluorinated solvent could be used at a temperature above the melting point, though this would be a less suitable for some embodiments because of the need to maintain the elevated temperature. For example, a fluorinated material that is a solid at room temperature but a liquid at a moderately elevated temperature such as 50° C. can be considered as a "low-melting" solvent.

Figure 3:
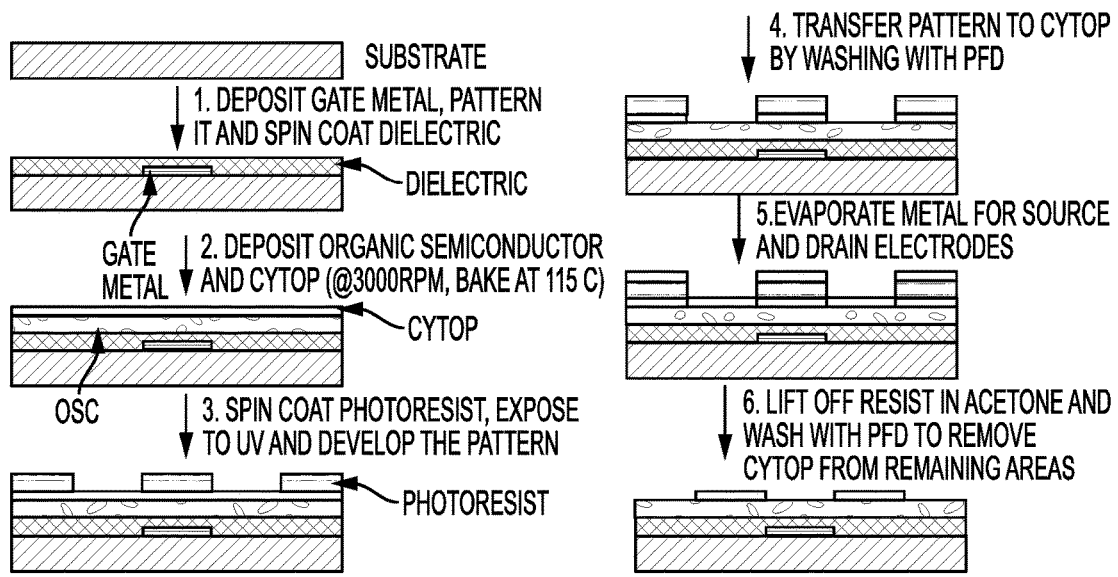
FIG. 3 is a schematic illustration of a method of producing a spatially patterned structure according to another embodiment of the current invention that includes photolithography.
Figure 4:
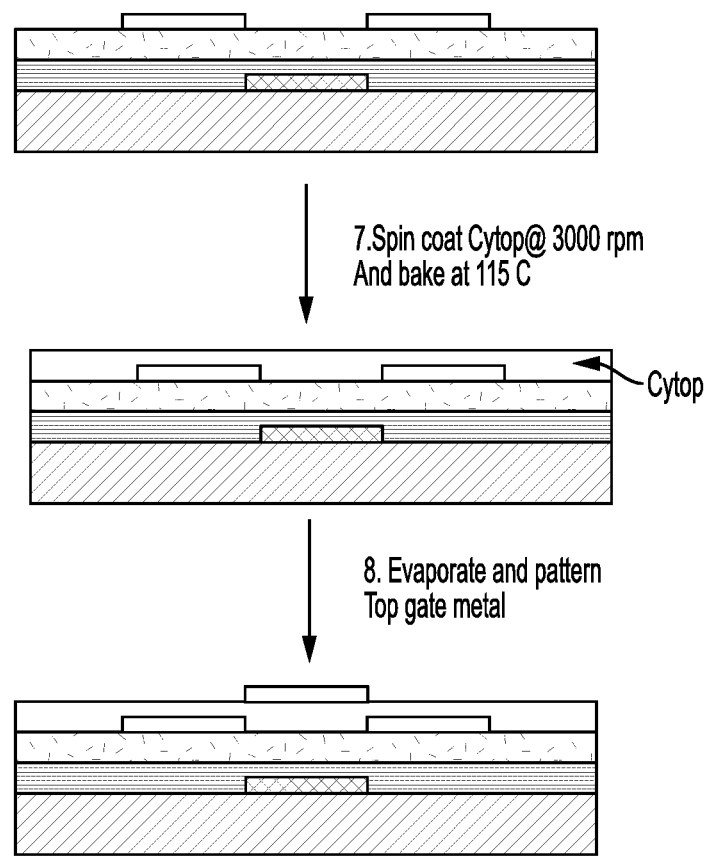
FIG. 4 is a schematic illustration of a method of producing a spatially patterned structure according to another embodiment of the current invention that can use the steps illustrated in FIG. 3 as an initial stage of the method.

FIGS. 3 and 4 provide further examples of methods of producing spatially patterned structures according to some embodiments of the current invention. In this example we further describe large scale, lithographically patterned top contact and double gate OTFT circuits which have not been possible using conventional lithography methods. Also, such top contact circuits can be used as sensor arrays which would greatly increase the sensitivity and selectivity as compared to conventional single organic transistor based sensors. This technique can also be used to pattern films of biological materials.

FIG. 3 is a schematic illustration of a method of producing a top contact transistor as an example of a spatially patterned structure according to an embodiment of the current invention. In this example, a gold gate contact, silicon oxide gate dielectric, organic semiconductor, and CYTOP are sequentially deposited onto a substrate. The CYTOP is deposited by spincoating followed by baking at 115 degrees C. The CYTOP is briefly surface oxidized with oxygen plasma to increase the surface adhesion. A photoresist is spincoated onto the CYTOP, exposed to UV light through a mask, and developed in the conventional manner. Further development by washing with perfluordecalin exposes the organic semiconductor surface where the photoresist had been removed. Metal is thermally evaporated in vacuum, forming source and drain contacts on the semiconductor. The undesired metal, photoresist, and CYTOP are removed by immersion in acetone followed by immersion in perfluorodecalin.

FIG. 4 is a schematic illustration of a method of producing a double gate transistor according to an embodiment of the current invention. An additional film of CYTOP is spin-coated onto the final device produced according to the method of FIG. 3, and baked at 115 degrees C. An additional gate contact is formed by photolithographic definition as for the source and drain electrodes of FIG. 3, except the step of transferring the pattern to CYTOP is omitted. The gate contact is formed by thermal evaporation onto the CYTOP, and residual photoresist and undesired metal are removed by immersion in acetone. The CYTOP remains to serve as a second gate dielectric.

Figure 5A:
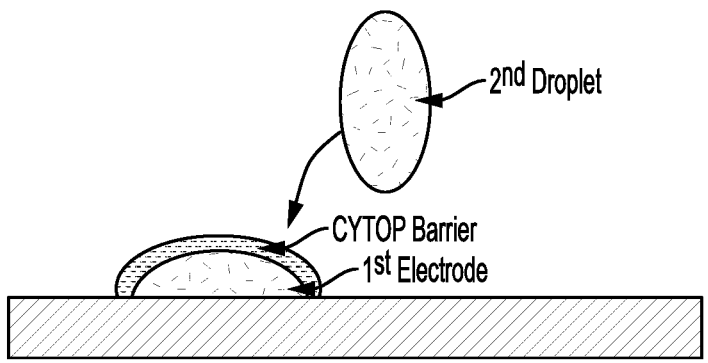
FIGS. 5A-5F provide a schematic illustration of a method of producing a spatially patterned structure according to another embodiment of the current invention that includes a solution-based printing process.
Figure 5B:
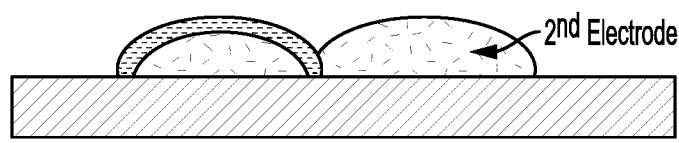
Figure 5C:
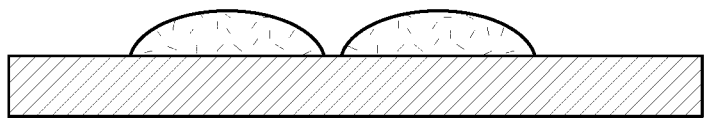
Figure 5D:
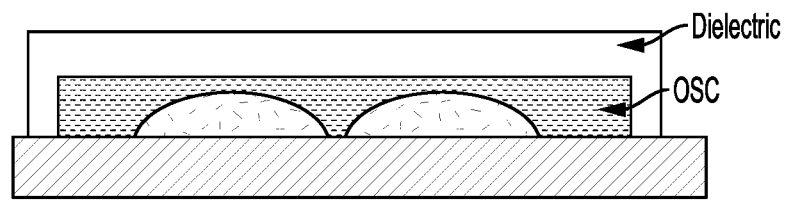

FIGS. 5A-5F provide a schematic illustration of a method of producing a spatially patterned structure according to another embodiment of the current invention. In FIG. 5A the first electrode material is printed and then a coat of CYTOP of sub micron thickness (~50-500 nm) is formed on top of the first electrode. The second electrode material is then formed close to or on top of the first electrode (bead), as illustrated in FIG. 5B. Because of dewetting from the CYTOP layer, it forms a boundary at the interface. The layer of CYTOP is then washed away with a fluorinated solvent, such as PFD for example. The bather layer of CYTOP thus assists with arranging the first and second electrodes close together with sub-micron resolution without them overlapping (FIG. 5C). Organic semiconductor and dielectric materials can then be formed, for example by printing (FIG. 5D).

Figure 5E:
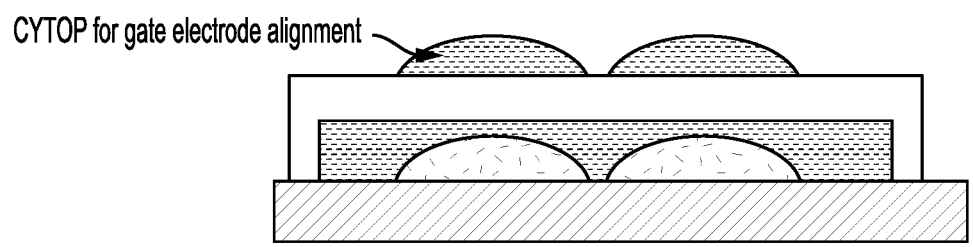
Figure 5F:
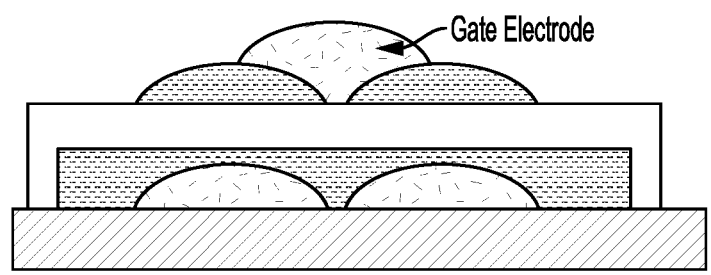

CYTOP is then printed on top of the dielectric as a precursor for self alignment of a gate electrode (FIG. 5E). Finally, a gate electrode is printed on top of the CYTOP on the dielectric (FIG. 5F).

Figure 5G:
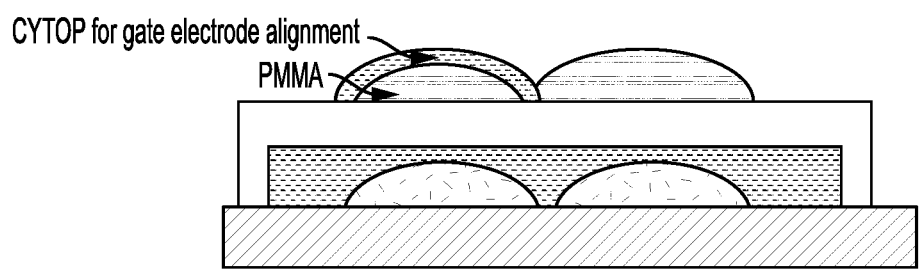
FIGS. 5G-5H provide a schematic illustration of a method of producing a spatially patterned structure according to another embodiment of the current invention that includes a solution-based printing process.
Figure 5H:
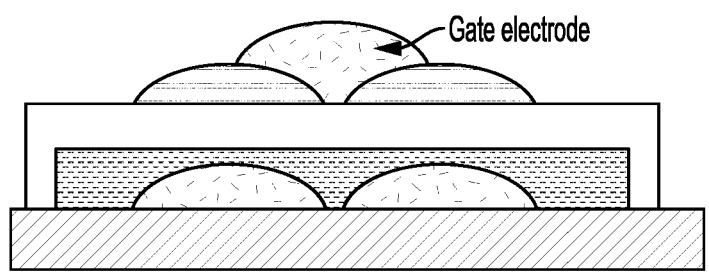
Figure 6A:
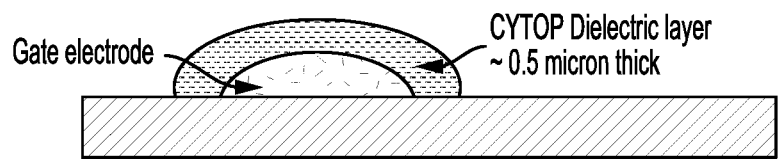
FIGS. 6A-6C provide a schematic illustration of a method of producing a spatially patterned structure according to another embodiment of the current invention that includes a solution-based printing process.
Figure 6B:
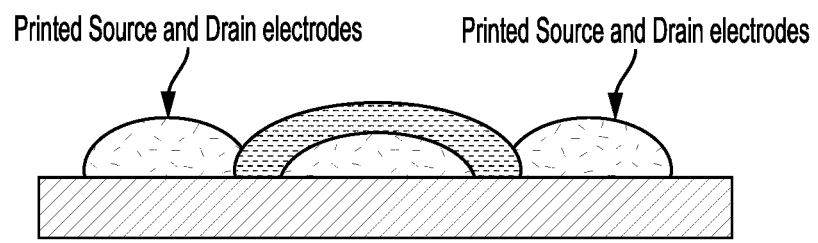
Figure 6C:
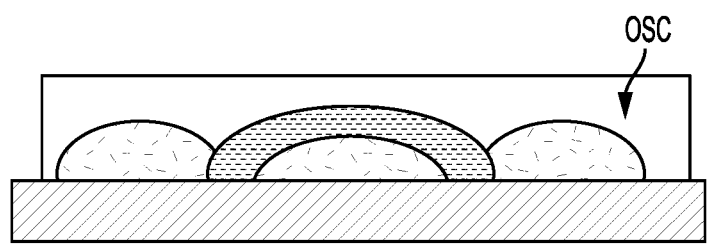

As an alternative to the step in FIG. 5E, another material such as an insulating polymer can be deposited in droplets and coated with CYTOP or other fluorinated material. Further droplets can be deposited, utilizing the dewetting property of the CYTOP. Then the CYTOP can be dissolved with a fluorinated solvent prior to final electrode deposition. One such example is shown schematically in FIGS. 5G and 5H. Steps 5A-5B are repeated in this case using the same printing alignment as used for step 5A but this time using an insulating polymer such as PMMA, PS, PE etc. In this case, the dielectric can be a cross-linkable polymer or an inorganic material that replaces steps 5E-5F by 5G-5H. This is followed by washing with PFD to remove CYTOP and then printing a gate electrode on top. Thus nanoscale alignment of the gate is made to the channel between the source and the drain FIGS. 6A-6C provide a schematic illustration of a method of producing a spatially patterned structure according to another embodiment of the current invention. In this example, a permanent layer of CYTOP is formed on the gate electrode and source and drain electrodes are formed next to it by a printing process. A layer of an organic semiconductor is deposited over the electrodes and CYTOP dielectric layer to provide the transistor structure.

Figures 7, 7A:
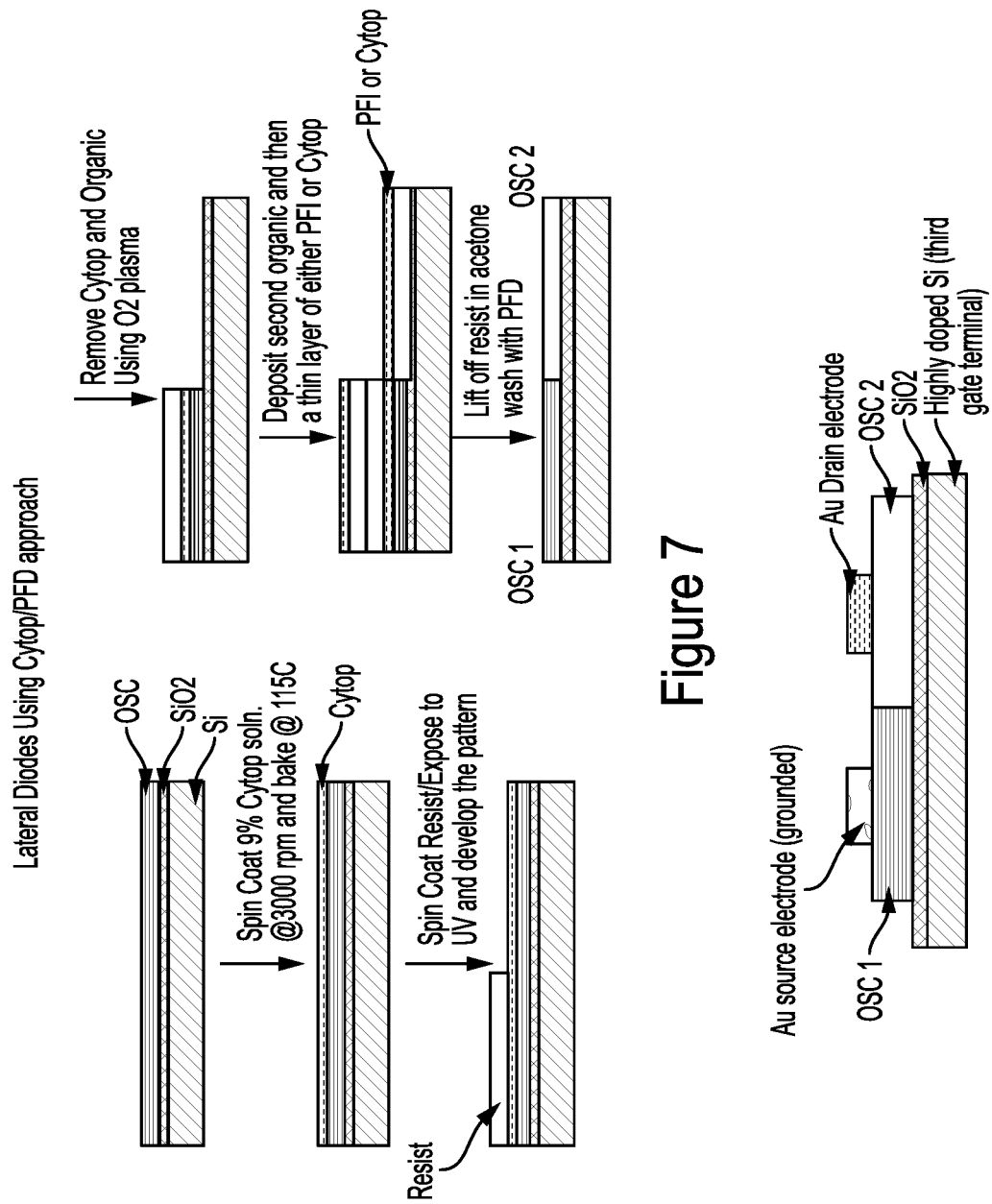
FIG. 7 is a schematic illustration of a method of producing a spatially patterned structure according to another embodiment of the current invention.
FIG. 7A is a schematic illustration of a thin-film, lateral heterojunction, organic diode according to an embodiment of the current invention which can be made by the method of FIG. 7.

FIG. 7 is a schematic illustration of a method of producing thin-film, lateral heterojunction, organic diodes according to an embodiment of the current invention. The lithographic patterning according to this embodiment ensured that the junction was precisely in a lateral arrangement and there was essentially no overlap or mixing of the two semiconductors. This embodiment of the current invention can also provide the ability to reproducibly fabricate patterned organic semiconductors without damage to its morphology and electronic properties and can also leave the organic semiconductor surface open for further processing and/or investigation.

As an example, laterally defined heterojunctions were fabricated using the process steps shown in FIG. 7 according to an embodiment of the current invention. A schematic illustration of a thin-film, lateral heterojunction, organic diode according to an embodiment of the current invention is shown in FIG. 7A. Such a diode can be made by the method illustrated in FIG. 7; however, the structure of the diode is novel irrespective of the method of manufacture. Previous attempts at patterning organic semiconductors had a problem that the semiconductors were covered by a barrier layer (Kymissis method) or the removal of a barrier layer resulted in damage to the organic semiconductor (Mallairas method). According to an embodiment of the current invention, fluorinated barrier layers that are soluble only in fluorinated solvents are used. These are completely orthogonal to any other non-fluorinated or partially-fluorinated material. Here both CYTOP and perfluoroeicosane can be used interchangeably, for example, with the flexibility that the former can be spin coated and the latter can be thermally evaporated under high vacuum. This technique is a general method that can be used to pattern other soft matter films using photolithography while retaining the functional properties of the film.

In this example, a 50 nm 5FPE-NTCDI film was thermally evaporated in a high vacuum chamber at a substrate temperature of 120 degree C. to obtain good morphology and electrical characteristics. (The common term 5FPE-NTCDI refers to N,N'-bis(2-(pentafluorophenyl)ethyl)naphthalene-1,4,5,8-tetracarboxylic diimide.) After patterning the NTCDI film the P3HT film was spin coated from solution in 1, 2 dichlorobenzene (10 mg/ml) at 1500 rpm for 90 seconds. (The common term P3HT stands for regioregular poly(3-hexylthiophene).) After fabricating the lateral heterojunction, gold electrodes were evaporated (in a vacuum chamber) as top contacts using a metal shadow mask with separation of 200 μm. The substrates used were highly doped silicon wafers with 300 nm thermally grown $SiO_2$.

We have measured diode characteristics for different semiconductor combinations as a function of doping one OSC and as a function of gate bias according to some embodiments of the current invention. We show the tuning of the rectification ratio by the application of gate voltage by almost two orders of magnitude.

Figure 8:
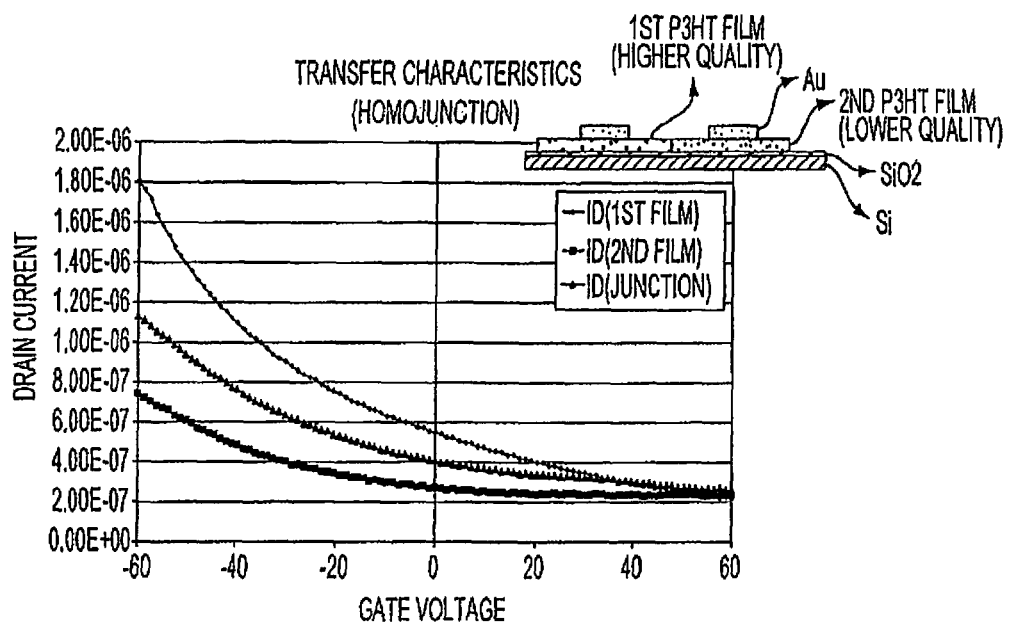
FIG. 8 shows the transfer characteristics of diode homojunctions according to an embodiment of the current invention.
Figure 9:
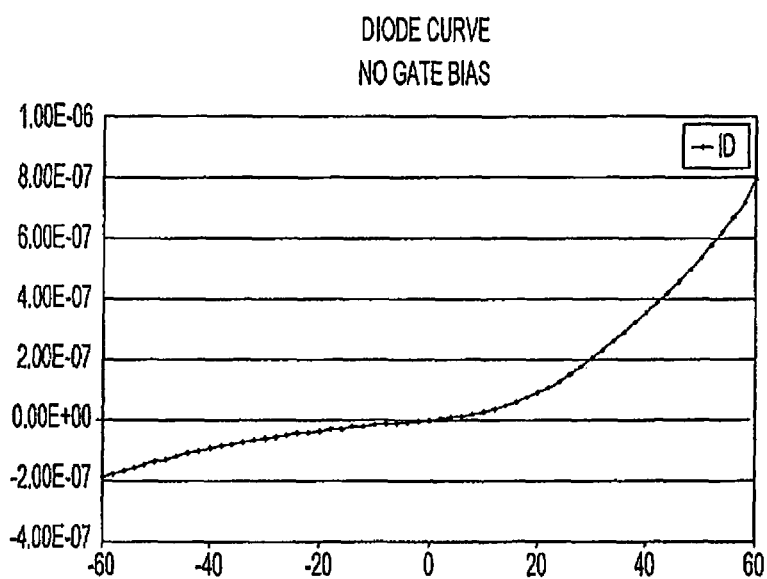
FIGS. 9-12 show measured diode characteristics and rectification ratio for a NTCDI and P3HT (Rieke Metals Grade) thin-film, lateral heterojunction, organic diode according to an embodiment of the current invention.
Figure 10:
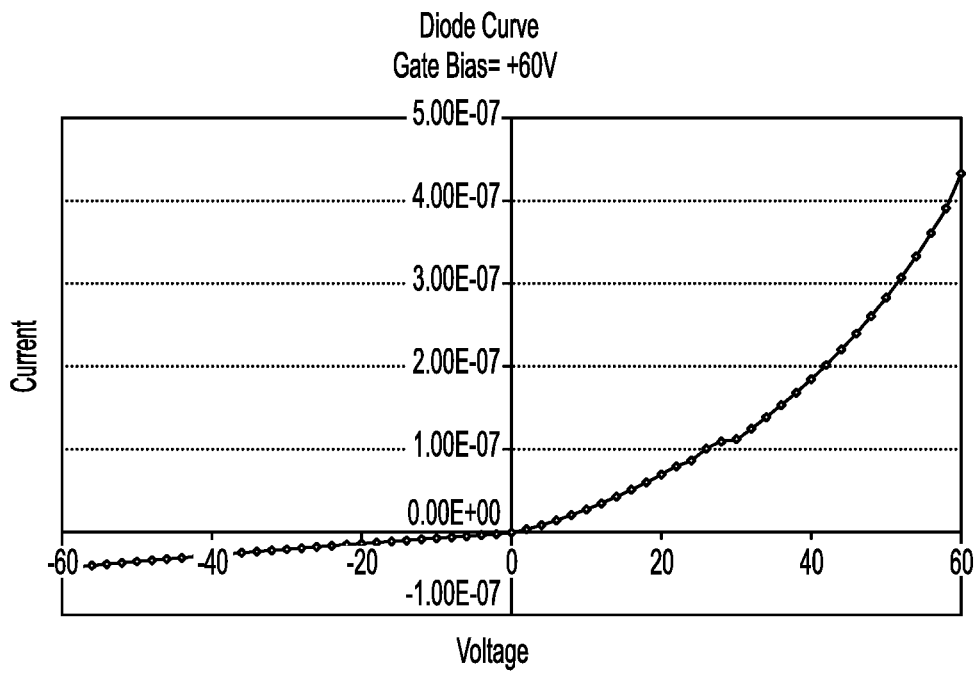
Figure 11:
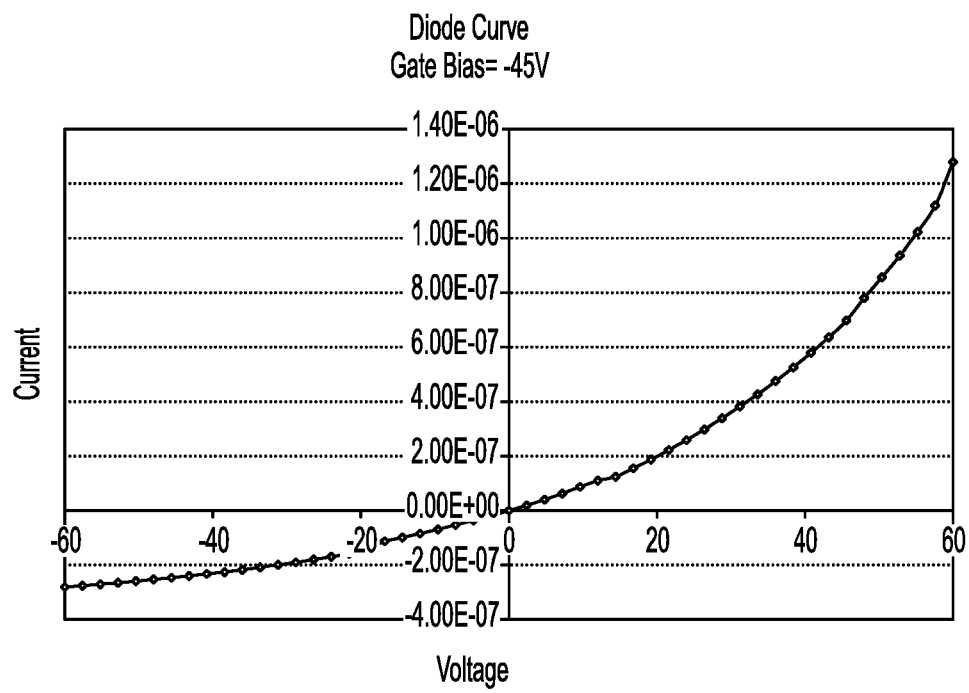
Figure 12:
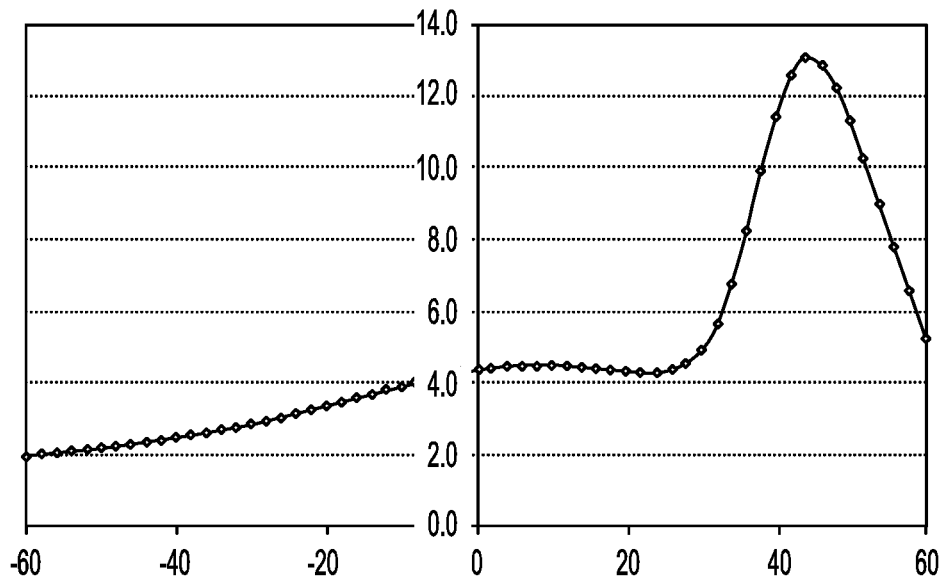
Figure 13:
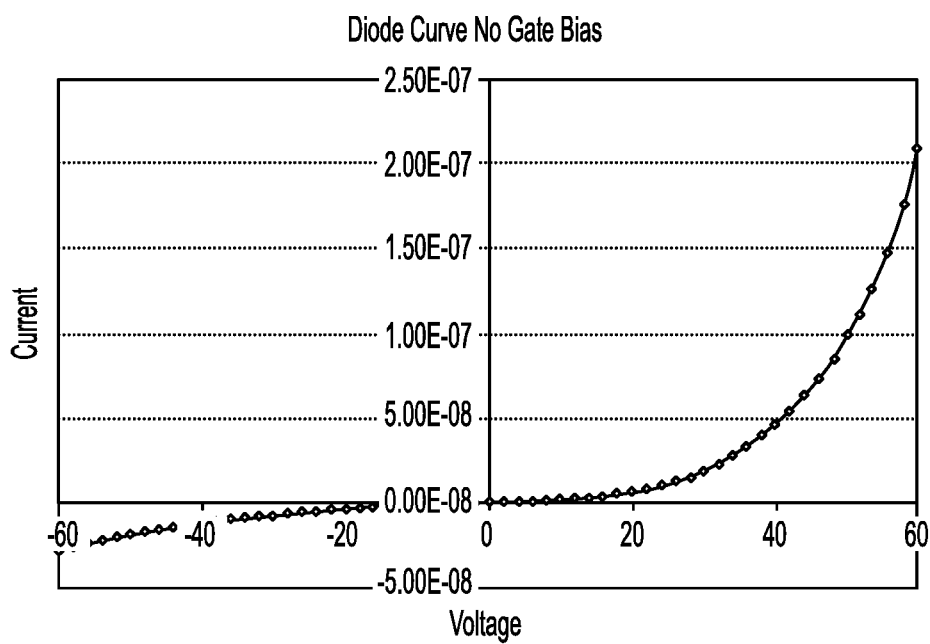
FIGS. 13-16 show measured diode characteristics and rectification ratio for a 5FPE-NTCDI with PLEXTRONICS grade high molecular weight P3HT thin-film, lateral heterojunction, organic diode according to an embodiment of the current invention.
Figure 14:
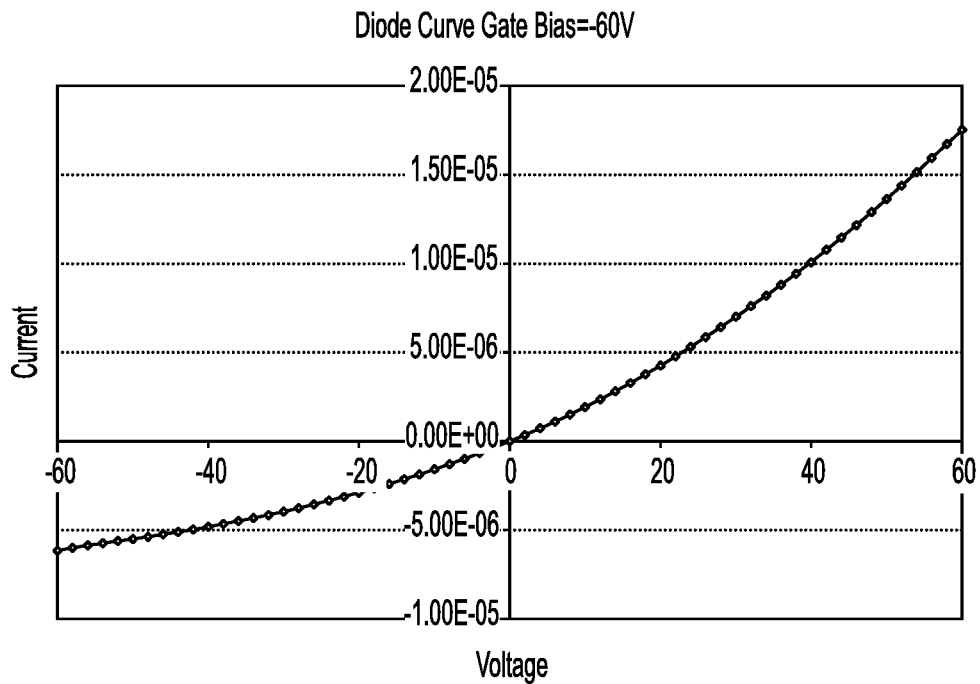
Figure 15:
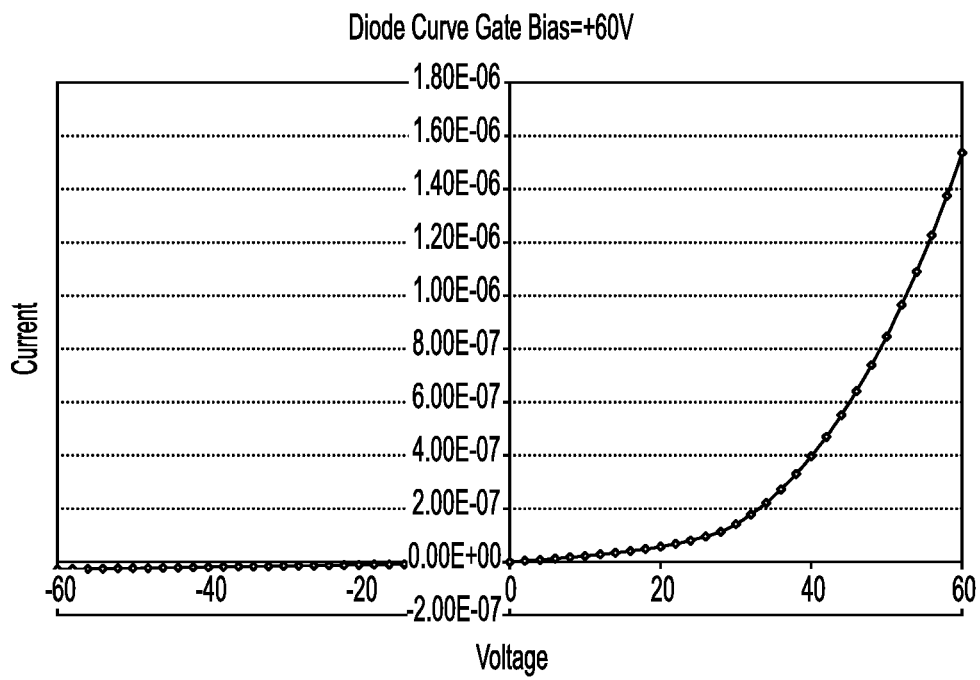
Figure 16:
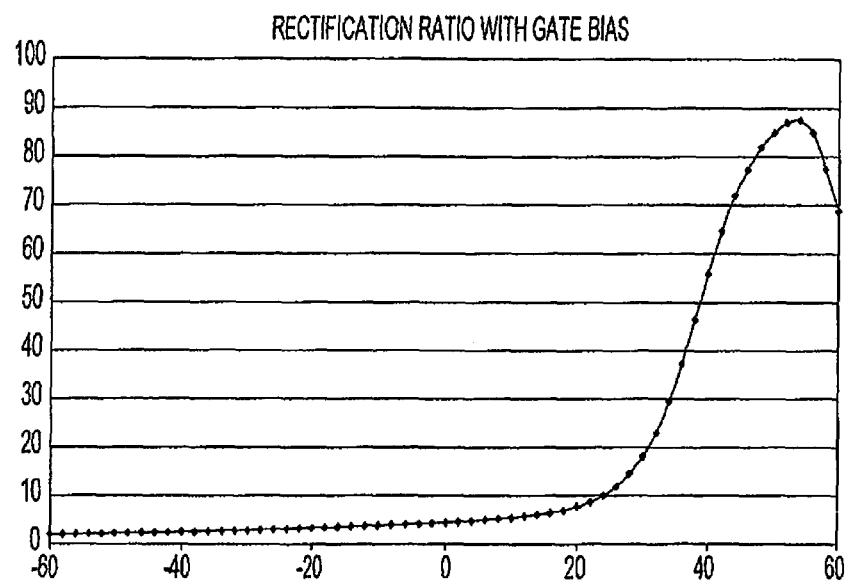

In order to confirm that the electrical quality of the lithographically prepared junction was good, we prepared samples with P3HT spin coated on both sides but with different film qualities. The first film was spin coated from a 10 mg/ml solution of P3HT in 1, 2 dichlorobenzene at 1500 rpm. The second film was spin coated from a 6 mg/ml solution of 1, 2 dichlorobenzene at 800 rpm. The remaining steps in the processing were the same as described above. FIG. 8 shows transfer characteristics of the junction vis-a-vis the individual films. The first film had better characteristics than the first one because of processing and annealing for 30 min in $N_2$ in a glove box at 120 degree C. No annealing treatment was done after the fabrication of the junction and hence the second film has lower performance as compared to the first one. As expected, the transfer characteristics of the junction are intermediate to that of the individual films. This control experiment clearly illustrates that the electronic quality of the junction is good even without the annealing treatment and the lithographic patterning technique does not cause damage.

FIGS. 9-16 show data for two examples of thin-film, lateral heterojunction, organic diodes according to an embodiment of the current invention. The diodes according to this embodiment of the current invention have thin films of p- and n-channel organic semiconductors formed laterally and in contact at a p-n heterojunction on a substructure. The substructure can include a substrate and dielectric layer, for example. The diode has a first electrode attached to the p-channel semiconductor and a second electrode attached to the n-channel semiconductor. In some embodiments, the thin-film, lateral heterojunction, organic diode can have a third electrode arranged proximate the p-n heterojunction to selectively adjust the electric field at the p-n heterojunction. For example, the substrate can provide the third electrode in some embodiments (See FIG. 7A for an example of a highly doped Si substrate as the third electrode that has a $SiO_2$ layer to provide a dielectric layer between the third electrode and the lateral semiconductor layers). However, one of ordinary skill in the art should recognize, based on the teachings herein, that numerous alternative structural arrangements are included within the general concepts of the current invention.

In another example according to an embodiment of the current invention, a diode was produced according to the method illustrated schematically in FIG. 7. This shows the process flow diagram for lithographic fabrication of a lateral heterojunction using CYTOP as a barrier layer and perfluorodecalin as a selective solvent. We used P3HT as the p-channel organic semiconductor material and F16CuPc as the n-channel organic semiconductor material. (The term F16CuPc stands for copper hexadecafluorophthalocyanine.)

Figure 17:
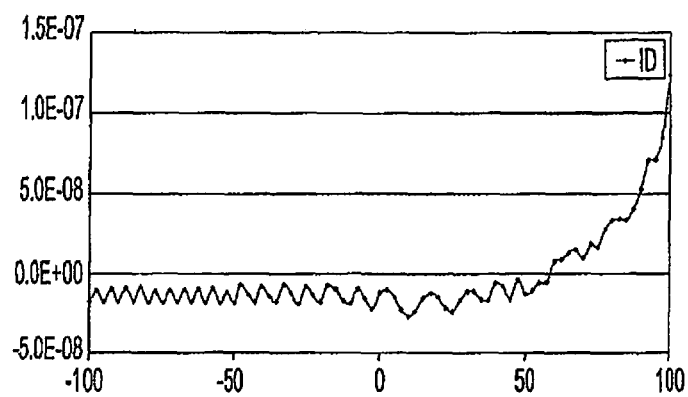
FIG. 17 shows measured diode characteristics of a lateral diode according to an embodiment of the current invention.

Gold electrodes were either deposited as top contacts by shadow masking after fabricating the heterojunction or pre-patterned lithographically in a bottom contact configuration. The substrates used were highly doped silicon wafers with 300 nm thermally grown $SiO_2$. An 80 nm F16CuPc film was thermally evaporated in a high vacuum chamber at a substrate temperature of 120° C. After patterning the F16CuPc film, the P3HT film was spin coated from solution in chlorobenzene (8 mg/ml) at 1500 rpm for 60 seconds. FIG. 17 shows the diode characteristics of this lateral diode.

In conclusion, we have demonstrated working lateral heterojunctions according to some embodiments of the current invention using photolithographic methods of production according to an embodiment of the current invention. The method in itself is general and can be applied to pattern films of soft materials (small molecules, polymers, biological films) without damage to structural form and functionality. This is the first demonstration of a lateral diode based on organic semiconductors which can be electrostatically doped to alter its built in potential difference and hence change it performance characteristics. However, methods of manufacture and devices according to embodiments of the current invention are not limited to specific examples described.

In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A method for producing a spatially patterned structure, comprising:
    forming a layer of a material on at least a portion of a substructure of the spatially patterned structure;
    forming a barrier layer of a fluorinated material on said layer of material;
    forming a layer of a photoresist on said barrier layer;
    exposing said photoresist to spatially patterned radiation;
    developing said photoresist to substantially remove one of exposed or unexposed regions of said photoresist to provide a pattern of uncovered regions of barrier material between regions covered by photoresist; and
    removing portions of said uncovered regions of barrier material using a plasma etch.

2. The method of claim 1 wherein said material comprises at least one of an organic material, a polymeric material, an organometallic material or a biological material.

3. The method of claim 1 wherein said plasma etch further removes said layer of material beneath the uncovered regions of barrier material thereby forming uncovered regions of substructure.

4. The method of claim 3 further comprising forming a layer of a second material over said regions covered by the photoresist and over said uncovered regions of substructure.

5. The method of claim 4 further comprising forming a second barrier layer of a fluorinated material over said layer of second material.

6. The method of claim 5 further comprising removing said barrier layers using a fluorinated solvent.

7. The method of claim 3 wherein said second material comprises at least one of an organic material, a polymeric material, an organometallic material or a biological material.

* * * * *